United States Patent
Kato et al.

(10) Patent No.: US 9,692,099 B2
(45) Date of Patent: Jun. 27, 2017

(54) ANTENNA-MATCHING DEVICE, ANTENNA DEVICE AND MOBILE COMMUNICATION TERMINAL

(75) Inventors: Noboru Kato, Nagaokakyo (JP); Satoshi Ishino, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 512 days.

(21) Appl. No.: 13/467,079

(22) Filed: May 9, 2012

(65) Prior Publication Data

US 2012/0218165 A1 Aug. 30, 2012

Related U.S. Application Data

(63) Continuation of application No. PCT/JP2010/070886, filed on Nov. 24, 2010.

(30) Foreign Application Priority Data

Dec. 1, 2009 (JP) .................. 2009-273155
Dec. 8, 2009 (JP) .................. 2009-278238

(51) Int. Cl.
*H01P 1/213* (2006.01)
*H01Q 1/24* (2006.01)
(Continued)

(52) U.S. Cl.
CPC ............ *H01P 1/2135* (2013.01); *H01P 1/213* (2013.01); *H01Q 1/24* (2013.01); *H01Q 5/335* (2015.01); *H03H 7/38* (2013.01)

(58) Field of Classification Search
CPC ....... H01P 1/213; H01P 1/2135; H01Q 5/335; H03H 7/38

(Continued)

(56) References Cited

U.S. PATENT DOCUMENTS 5,696,372 A 12/1997 Grober et al.
6,873,299 B2 * 3/2005 Dakeya et al. ............... 343/745
(Continued)

FOREIGN PATENT DOCUMENTS

CN 101002362 A 7/2007
CN 101232127 A 7/2008
(Continued)

OTHER PUBLICATIONS

Official Communication issued in corresponding German Patent Application No. 11 2011 100 580.6, mailed on Apr. 2, 2013.
(Continued)

*Primary Examiner* — Robert Karacsony
*Assistant Examiner* — Amal Patel
(74) *Attorney, Agent, or Firm* — Keating & Bennett, LLP

(57) ABSTRACT

An antenna-matching device includes a first antenna terminal that is connected to a first radiating element, a second antenna terminal that is connected to a second radiating element, power feeding terminals and that are connected to a power-feeding unit C, an antenna coupling circuit (coupling inductance element L) that is connected in series between the antenna terminals, and a matching unit B that is connected between the antenna terminals and the power feeding terminals. The coupling inductance element L and the matching unit are integrally provided in a substrate. The matching circuit B is connected in series with the signal lines and includes a first resonant circuit and a second resonant circuit that have different resonant frequencies from each other and are coupled with each other. The matching unit B is connected to a power-feeding circuit that includes an RF circuit.

11 Claims, 10 Drawing Sheets

(51) Int. Cl.
*H03H 7/38* (2006.01)
*H01Q 5/335* (2015.01)

(58) Field of Classification Search
USPC .......................................... 343/852–853, 860
See application file for complete search history.

(56) References Cited

U.S. PATENT DOCUMENTS

| | | | |
|---|---|---|---|
| 2004/0217915 A1 | 11/2004 | Imaizumi | |
| 2004/0263411 A1 | 12/2004 | Fabrega-Sanchez et al. | |
| 2007/0252703 A1* | 11/2007 | Kato | G06K 19/07749 |
| | | | 340/572.8 |
| 2008/0174508 A1 | 7/2008 | Iwai et al. | |
| 2008/0246682 A1 | 10/2008 | McLean | |
| 2008/0258983 A1 | 10/2008 | Bauer et al. | |
| 2009/0262041 A1* | 10/2009 | Ikemoto et al. | 343/860 |
| 2009/0278755 A1* | 11/2009 | Shoji | 343/745 |
| 2009/0284431 A1* | 11/2009 | Meharry | H01Q 9/065 |
| | | | 343/816 |

FOREIGN PATENT DOCUMENTS

| | | |
|---|---|---|
| JP | 62-24510 U | 2/1987 |
| JP | 08-065089 A | 3/1996 |
| JP | 2004-336250 A | 11/2004 |
| JP | 2005-260833 A | 9/2005 |
| JP | 2007-282091 A | 10/2007 |
| JP | 2009-027341 A | 2/2009 |
| JP | 2009-218872 A | 9/2009 |
| WO | 2008/124442 A1 | 10/2008 |
| WO | 2008/149946 A1 | 12/2008 |

OTHER PUBLICATIONS

Official Communication issued in corresponding European Patent Application No. 10834512.5, mailed on Mar. 6, 2014.
Official Communication issued in International Patent Application No. PCT/JP2010/070886, mailed on Mar. 8, 2011.
Chen et al., "A Decoupling Technique for Increasing the Port Isolation Between Two Strongly Coupled Antennas," IEEE Transactions on Antennas and Propagation, vol. 56, No. 12, Dec. 2008, pp. 3650-3658.

* cited by examiner

ANTENNA-MATCHING DEVICE, ANTENNA DEVICE AND MOBILE COMMUNICATION TERMINAL

BACKGROUND OF THE INVENTION

1. Field of the Invention

The present invention relates to antenna-matching devices, antenna devices and mobile communication terminals, and in particular relates to an antenna-matching device that is preferably used for an antenna of a mobile communication terminal such as a cellular phone, and also relates to an antenna device and a mobile communication terminal equipped with the antenna device.

2. Description of the Related Art

To date, in mobile communication terminals, a matching circuit has been used to perform impedance matching between an antenna and a power-feeding unit (including an RF circuit) that is connected to the antenna. As a matching circuit of this type, a technology is known in which elements that constitute a matching circuit are integrated into a multilayer substrate, as described in Japanese Unexamined Patent Application Publication No. 2004-336250. Moreover, a technique for forming a wide band antenna by coupling two radiating elements that make up a dipole antenna with each other through a coupling coil element is described in Japanese Unexamined Utility Model Registration Application Publication No. 62-24510.

If elements that constitute the matching circuit and the coupling coil element are mounted as separate components, the space that is used for mounting these components becomes large and it is difficult to use such a configuration in mobile communication terminals, for which size reduction is demanded. Furthermore, it is also necessary to match the impedances of these elements, which complicates the design of impedance characteristics.

On the other hand, an antenna including a base plate, a power feeding point and a monopole antenna radiating element, as illustrated in FIG. 15 of Japanese Unexamined Patent Application Publication No. 2007-282091, and an inverted-F antenna, as illustrated in FIG. 16 of Japanese Unexamined Patent Application Publication No. 2007-282091, are known examples of conventional antennas of a type that are to be built into terminal devices. However, these antennas have a narrow frequency band and it is difficult to use them in a wide frequency band.

SUMMARY OF THE INVENTION

Accordingly, preferred embodiments of the present invention provide an antenna-matching device for which a reduction in size can be achieved and for which the design of impedance characteristics is simple. Other preferred embodiments of the present invention provide an antenna device and a mobile communication terminal that can be used in a wide frequency band.

An antenna-matching device according to a preferred embodiment of the present invention includes a first antenna terminal to be connected to a first radiating element, a second antenna terminal to be connected to a second radiating element, a power feeding terminal to be connected to a power-feeding unit, an antenna coupling circuit that is connected in series between the first antenna terminal and the second antenna terminal, and a matching circuit that is connected between the first and second antenna terminals, and the power feeding terminal, wherein the antenna coupling circuit and the matching circuit are integrally provided in a substrate.

Since the antenna coupling circuit to achieve band widening by coupling the first radiating element and the second radiating element to each other and the matching circuit to achieve impedance matching between the antenna unit and the power-feeding unit are both integrally provided in a substrate, the antenna-matching device can be reduced in size as a whole and the design of impedance characteristics is simplified.

An antenna device according to a second preferred embodiment of the present invention includes an antenna unit and a matching unit that is connected to the antenna unit, wherein the antenna unit includes a first radiating element and a second radiating element, which are respectively connected to a pair of signal lines, and a coupling element that couples the first and second radiating elements to each other, and the matching unit is connected in series with the pair of signal lines and includes a first resonant circuit and a second resonant circuit that have different resonant frequencies from each other and are coupled with each other.

A mobile communication terminal according to a third preferred embodiment of the present invention has built thereinto an antenna device that includes an antenna unit and a matching unit that is connected to the antenna unit, wherein the antenna unit includes a first radiating element and a second radiating element, which are respectively connected to a pair of signal lines, and a coupling element that couples the first and second radiating elements to each other, the matching unit is connected in series with the pair of signal lines and includes a first resonant circuit and a second resonant circuit that have different resonant frequencies from each other and are coupled with each other, and the matching unit is connected to a power-feeding circuit that includes an RF circuit.

The antenna unit has a large gain over a wide band due to the first radiating element and the second radiating element, which are respectively connected to the pair of signal lines, being coupled with each other through a coupling element (preferably, an inductance element). The matching unit is connected in series with the pair of signal lines and includes the first resonant circuit and the second resonant circuit, which have different resonant frequencies from each other and are coupled with each other, such that the matching unit causes the impedance of the antenna unit to match the impedance of the power-feeding circuit over a wide band. Thus, as a result of including a wide-band antenna unit and a matching unit that is capable of matching impedances over a wide band, the antenna device according to a preferred embodiment of the present invention can be used over a wide frequency band.

With the antenna-matching device according to the first preferred embodiment of the present invention, a reduction in size can be achieved and the design of impedance characteristics is simplified. Furthermore, with the antenna device and the mobile communication terminal according to the second and third preferred embodiments of the present invention, since the antenna device and the mobile communication terminal include a wide-band antenna unit and a matching unit that is capable of matching impedances over a wide band, communication can be performed over a wide frequency band.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 13A and 13B illustrate a third example of an antenna device module, wherein FIG. 13A is a plan view and FIG. 13B is a sectional view of essential elements.

FIGS. 14A and 14B illustrate a fourth example of an antenna device module, wherein FIG. 14A is a plan view and FIG. 14B is a sectional view.

FIGS. 15A-15C illustrate a fifth example of an antenna device module, wherein FIG. 15A is a plan view, FIG. 15B is a sectional view of a flexible substrate portion and FIG. 15C is a sectional view illustrating a modification of the flexible substrate portion.

DETAILED DESCRIPTION OF THE PREFERRED EMBODIMENTS

Hereafter, preferred embodiments of an antenna-matching device, an antenna device and a mobile communication terminal according to the present invention will be described with reference to the accompanying drawings. In each of the drawings, like components and portions are denoted by the same symbols and repeated description thereof will be avoided.

First Preferred Embodiment

Figure 1:
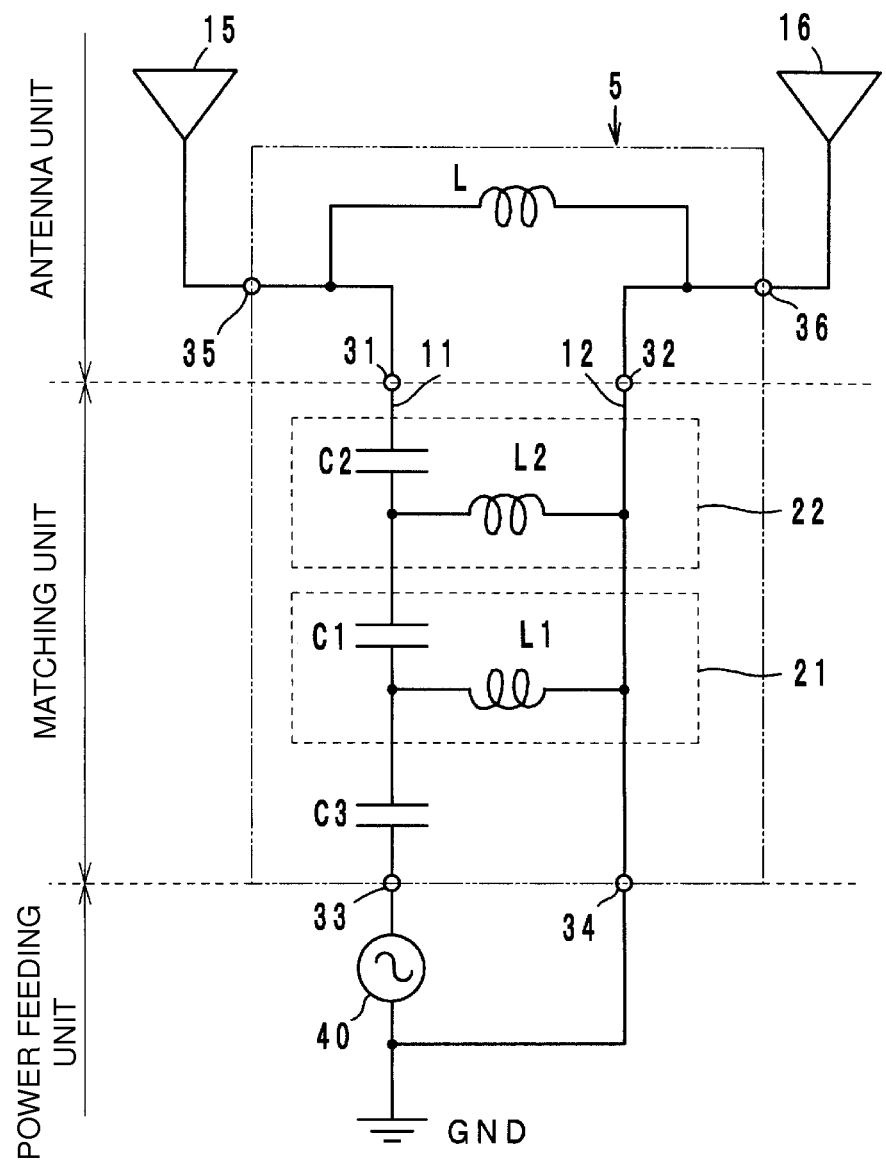
FIG. 1 is a block diagram illustrating a first preferred embodiment of an antenna device that includes an antenna-matching device.

An antenna device illustrated in FIG. 1 includes an antenna-matching device 5 and broadly speaking, preferably includes an antenna unit A and a matching unit B that is connected to the antenna unit A. A power-feeding unit C is connected to the matching unit B. The power-feeding unit C is incorporated into a mobile communication terminal such as a cellular phone. The antenna device including the antenna unit A and the matching unit B is modularized (refer to FIG. 9 to FIG. 12), which will be described below, and mounted in a mobile communication terminal.

The antenna unit A includes a first radiating element 15 and a second radiating element 16, which are respectively connected to a pair of signal lines 11 and 12, and a coupling circuit (coupling inductance element L) that couples the first and second radiating elements 15 and 16 to each other.

The matching unit B includes a first resonant circuit 21 that includes a first inductance element L1 and a first capacitance element C1 and a second resonant circuit 22 that includes a second inductance element L2 and a second capacitance element C2. The first and second resonant circuits 21 and 22 are connected in series with the pair of signal lines 11 and 12 and have different resonant frequencies from each other. The first and second inductance elements L1 and L2 are magnetically coupled with each other through a mutual inductance. Each of the inductance elements L1 and L2 is preferably defined by a coil conductor that is wound such that magnetic flux generated by these inductance elements defines a closed magnetic circuit. Therefore, the degree of coupling between the inductance elements L1 and L2 is about 0.7 to about 1.0, which is very high.

In more detail, one end of the first inductance element L1 is connected to one end of the second inductance element L2, and the other end of the first inductance element L1 is connected to the other end of the second inductance element L2 via the first capacitance element C1. Furthermore, one end of each of the first and second inductance elements L1 and L2 is connected to the second radiating element 16 through a terminal 32. The other end of the second inductance element L2 is connected to the first radiating element 15 through the second capacitance element C2 and a terminal 31. Furthermore, a third capacitance element C3 is connected between the first resonant circuit 21 and the power-feeding unit.

The power-feeding unit C includes a power-feeding circuit 40 that includes an RF circuit, which is not illustrated. One end of the power-feeding circuit 40 is connected to the third capacitor C3 through the terminal 33, and the other end of the power-feeding circuit 40 is connected to ground GND and to one end of each of the first and second inductance elements L1 and L2 though a terminal 34. That is, the power-feeding unit C is an unbalanced-type power-feeding unit and the ground GND is finite in size.

Here, numerical values of individual elements are given as illustrative examples and for example the coupling inductance element L has a value of 12 nH, the first inductance element L1 has a value of 11 nH, the second inductance element L2 has a value of 12 nH, the first capacitance element C1 has a value of 4 pF, the second capacitance element C2 has a value of 3.5 pF and the third capacitance element C3 has a value of 1 pF, for example.

Figure 2:
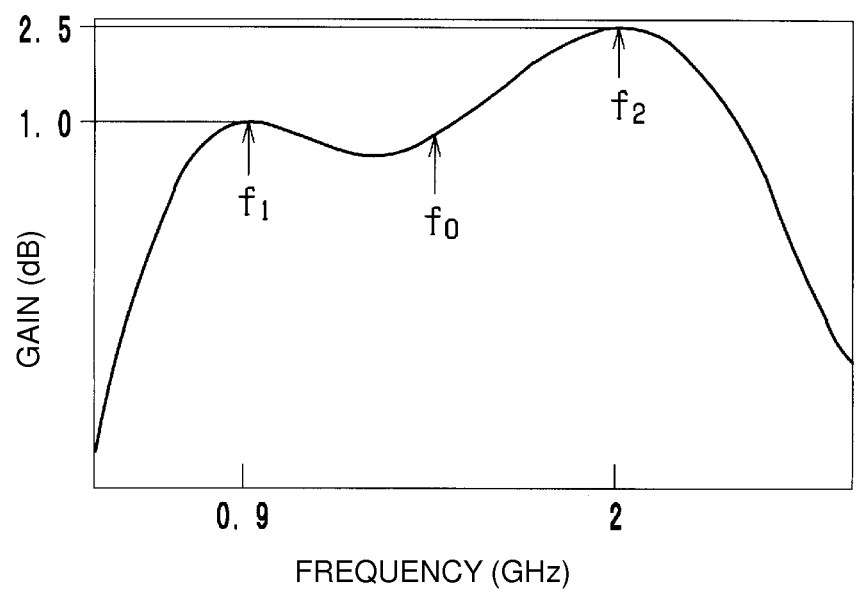
FIG. 2 is a graph illustrating gain with respect to frequency for an antenna unit included in the antenna device.

In the above-described configuration, the antenna unit A has a large gain over a wide band due to the first radiating element 15 and the second radiating element 16, which are respectively connected to the pair of signal lines 11 and 12, being coupled with each other through a coupling element, i.e., the inductance element L. Specifically, as illustrated in FIG. 2, the antenna unit A has excellent gain over a range from 900 MHz to 2.0 GHz. A frequency $f_0$ is a resonant frequency in the case where there is no coupling element (inductance element L). Degeneracy is removed by the coupling element, resonant frequencies $f_1$ and $f_2$ appear and it is possible to realize a wide band.

Figure 3:
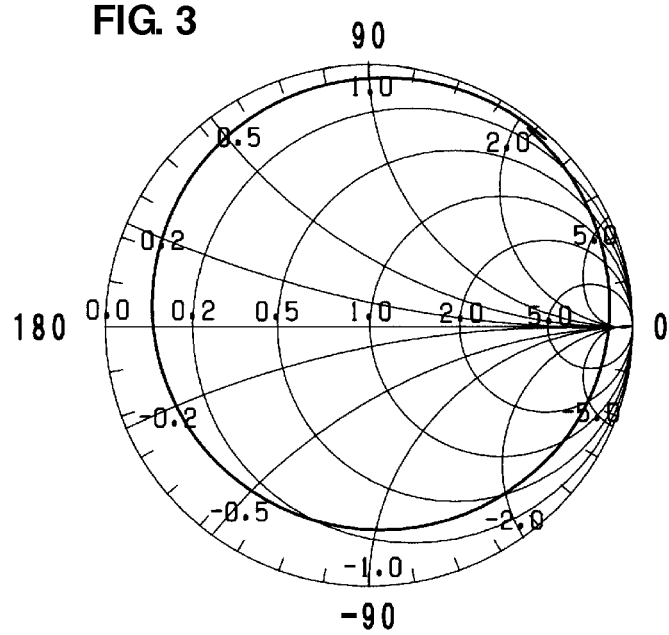
FIG. 3 is a Smith chart illustrating the impedance of the antenna unit.

Furthermore, the shapes of the first and second radiating elements 15 and 16 may be appropriately chosen and the radiation directivity can be made to have desired characteristics by adjusting these shapes. On the other hand, the impedance when the gain of the antenna unit A is in the positive region, as illustrated in the Smith chart of FIG. 3, greatly varies and is typically in the range of about 5Ω to about 30Ω, for example. The impedance of the power-feeding circuit 40 is preferably about 50Ω, for example.

Figure 4:
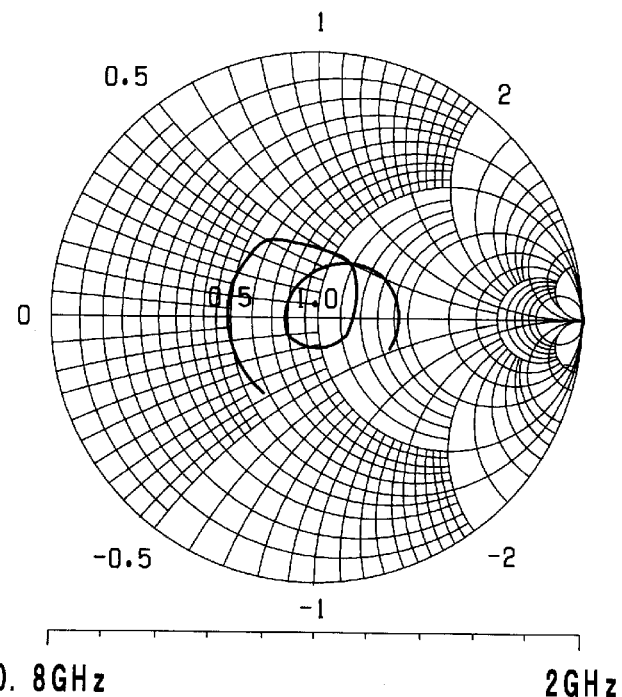
FIG. 4 is a Smith chart illustrating the impedance of a matching unit included in the antenna device.
Figure 5:
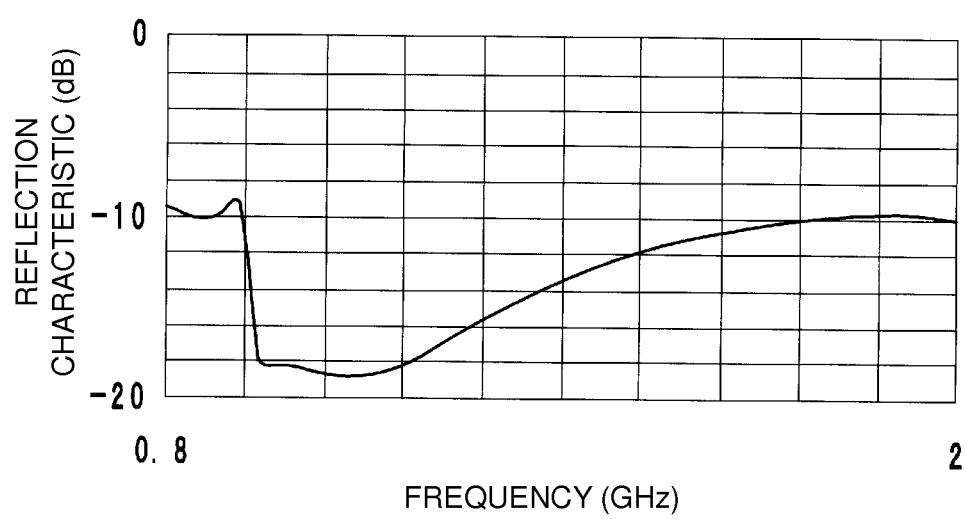
FIG. 5 is a graph illustrating the reflection characteristic of the matching unit with respect to frequency.

The matching unit B is connected in series with the pair of signal lines 11 and 12 and includes the first resonant circuit 21 and a second resonant circuit 22, which have different resonant frequencies from each other and are coupled with each other. As a result, the matching unit B performs causes the impedance of the antenna unit A and the impedance of the power-feeding circuit 40 to match each other over a wide band. Specifically, the matching unit B can adjust the real component of the impedance of the antenna unit A to 50Ω, as illustrated in the Smith chart of FIG. 4. In addition, the matching unit B, as illustrated in FIG. 5, has an excellent reflection characteristic over a range from 900 MHz to 2.0 GHz. The matching unit B does not affect the imaginary component of the impedance and the imaginary component comes to have various values.

Thus, the antenna device illustrated in FIG. 1 can be used over a wide frequency band as a result of being equipped with the wide-band antenna unit A and the matching unit B that is capable of performing impedance matching over a wide band. It is preferable that the electrical length of the antenna unit A be, for example, about λ/2 or less (λ being the frequency that is to be used) to perform impedance matching. This is an effective method of preventing an anti-resonance point (point that does not function as an antenna) from appearing in a specific band due to the impedance of the antenna changing by a large amount.

Furthermore, in the matching unit B, the LC resonant circuit may have multiple stages, i.e., more than two, and if a multi-stage configuration is adopted, impedance matching is more easily achieved. This point is also true in the following first and second modifications.

First Modification of Matching Unit

Figure 6:
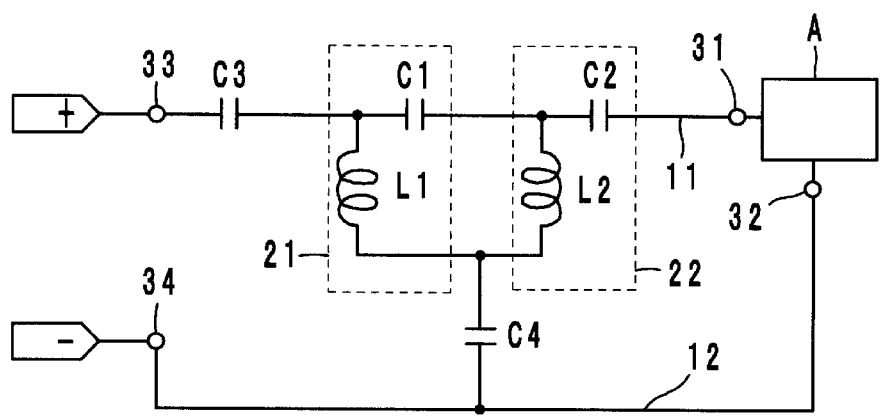
FIG. 6 is an equivalent circuit diagram illustrating a first modification of the matching unit.

According to a first modification illustrated in FIG. 6, in the matching unit B, one end of each of the first and second inductance elements L1 and L2 may be connected to the signal line 12 through a fourth capacitance element C4.

Second Modification of Matching Unit

Figure 7:
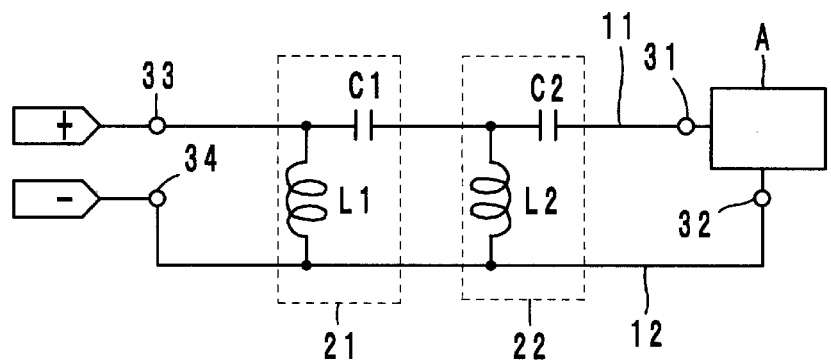
FIG. 7 is an equivalent circuit diagram illustrating a second modification of the matching unit.

According to a second modification illustrated in FIG. 7, the matching unit B may have a configuration in which the third capacitance element C3 and the fourth capacitance element C4 have been omitted.

Second Preferred Embodiment

Figure 8:
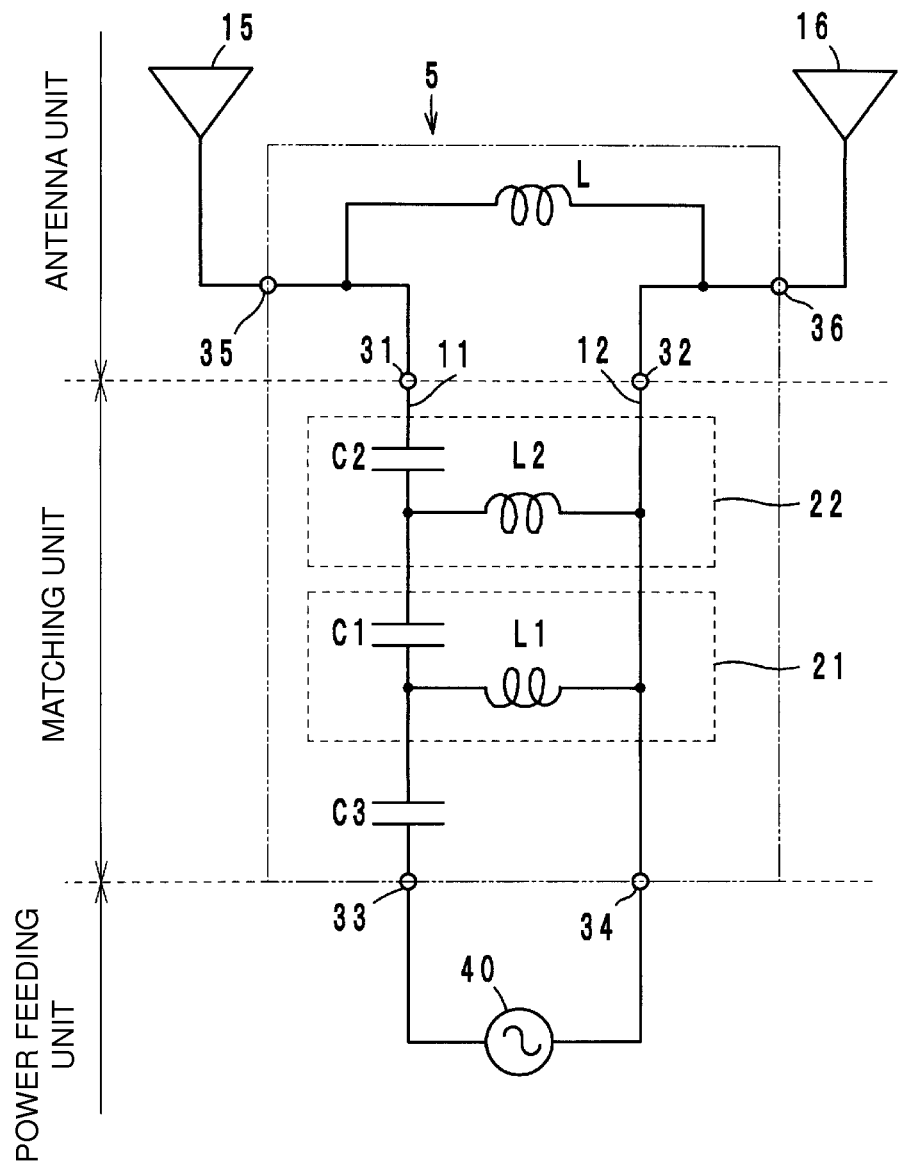
FIG. 8 is a block diagram illustrating a second preferred embodiment of an antenna device that includes an antenna-matching device.

An antenna device illustrated in FIG. 8 is equipped with the antenna-matching device 5 and the power-feeding unit C is a balanced-type power-feeding unit. In other respects, this antenna device preferably has the same configuration as the antenna device illustrated in FIG. 1. Therefore, the operational advantage of the antenna device illustrated in FIG. 8 is similar to that of the antenna device illustrated in FIG. 1.

First Module Example

Figure 9:
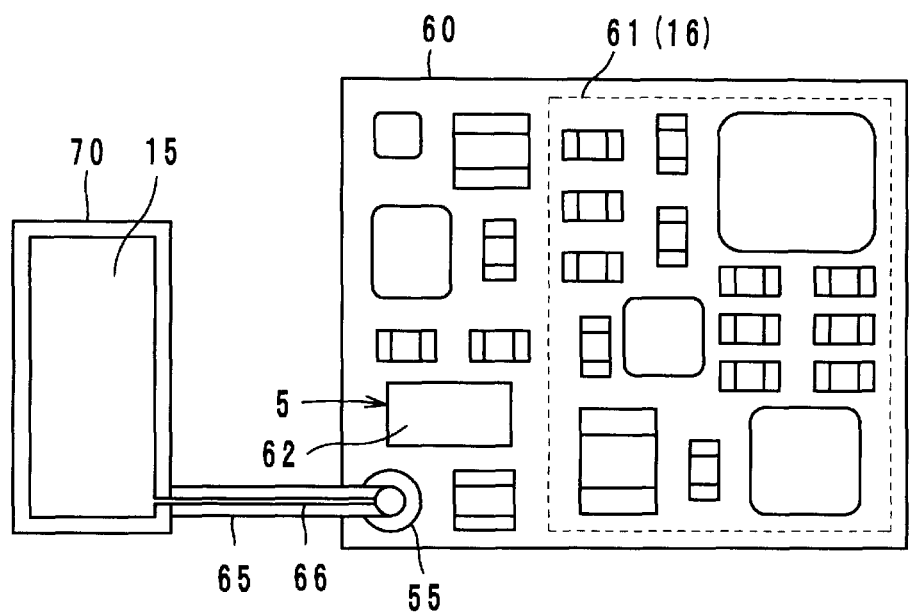
FIG. 9 is a plan view illustrating a first example of a module that includes an antenna-matching device.

A first example in which the antenna device is modularized is illustrated in FIG. 9. In the first module example, a ground electrode 61, which is built into a printed wiring substrate 60, which is mounted in a mobile communication terminal such as a cellular phone, also serves as the second radiating element 16. The first radiating element 15 preferably is a conductive film arranged on the surface of a substrate 70 and is connected to a connector 55 through a conductor 66 provided in a flexible substrate 65.

IC components and various chip-type elements included in various circuits of a mobile communication terminal such as a cellular phone, the connector 55 to provide connection to the power-feeding unit C, and the like are arranged on the printed wiring substrate 60. In addition, the antenna-matching device 5 is mounted on the printed wiring substrate 60. The antenna-matching device 5 includes a multilayer substrate 62 including dielectric layers such as ceramic or resin layers in which the matching unit B and the coupling inductance element L are arranged over multiple layers.

Once the antenna device has been modularized into an integrated unit in advance in this way, the work of mounting the antenna device in a mobile communication terminal such as a cellular phone is simple and the antenna device can be made to be compatible with mobile communication terminals having a variety of specifications by simply partially redesigning for example the matching unit B, and the design of the antenna device itself is simplified.

Figure 11:
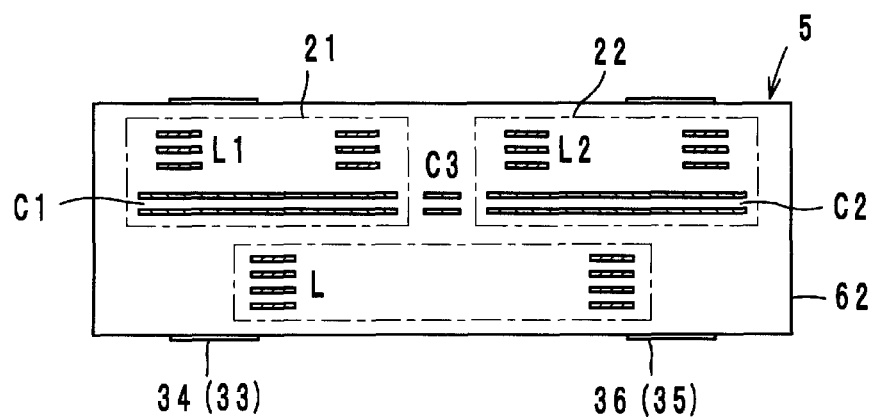
FIG. 11 is a sectional view illustrating the antenna-matching device.

As illustrated in FIG. 11, the first inductance element L1 preferably arranged in a coil shape and the first capacitance element C1 forming the first resonant circuit 21, and the second inductance element L2 preferably arranged in a coil shape and the second capacitance element C2 defining the second resonant circuit 22, are each built into the upper section of the multilayer substrate 62 of the antenna-matching device 5 as internal conductors. In addition, the third capacitance element C3 is built into the upper section of the multilayer substrate 62 as an internal conductor. Furthermore, the coupling inductance element L is built into the lower section of the multilayer substrate 62 as an internal conductor.

The internal conductors are connected to outer terminals 33 to 36 (refer to FIG. 10) arranged on a surface of the multilayer substrate 62. That is, as well as being connected to the outer terminal 33 through the third capacitance element C3, the first resonant circuit 21 and the second resonant circuit 22 are also connected to the outer terminal 34 (refer to the equivalent circuit of FIG. 1 for the connection relationship), and to the power-feeding unit C. In addition, as well as being connected to the first radiating element 15 through the outer terminal 35, the coupling inductance element L is also connected to the second radiating element 16 through the outer terminal 36.

That is, the antenna-matching device 5 includes the first antenna terminal 35 that is connected to the first radiating element 15, the second antenna terminal 36 that is connected to the second radiating element 16, the power feeding terminals 33 and 34 that are connected to the power-feeding unit C, an antenna coupling circuit (coupling inductance element L) that is connected in series between the first antenna terminal 35 and the second antenna terminal 36, and the matching unit B that is connected between the first and second antenna terminals 35 and 36 and the power feeding terminals 33 and 34.

Since the antenna coupling circuit (coupling inductance element L) to achieve band widening by coupling the first radiating element 15 and the second radiating element 16 to each other and the matching circuit (matching unit B) to achieve impedance matching between the antenna unit A and the power-feeding unit C are both integrally provided in the multilayer substrate 62, the thus-configured antenna-matching device 5 can be reduced in size as a whole and the design of impedance characteristics is simplified.

Furthermore, since dielectric layers that includes the first capacitance element C1 and the second capacitance C2 is provided between the first inductance element L1 and the second inductance element L2, and the coupling inductance element L, magnetic coupling between the inductance elements L1 and L2, and the inductance element L can be eliminated as much as possible.

Figure 10:
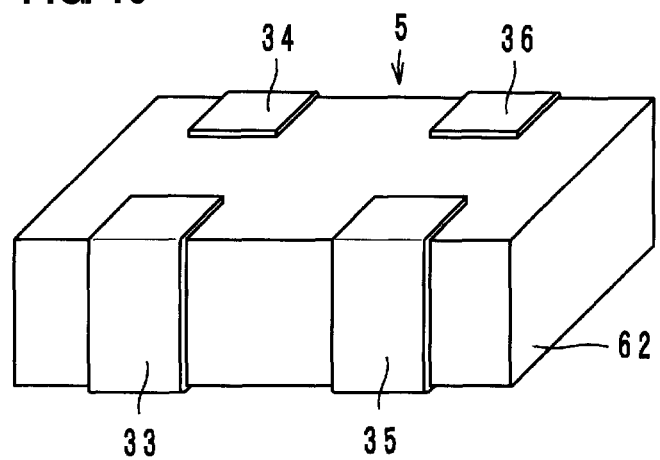
FIG. 10 is a perspective view illustrating the antenna-matching device.
Figure 12:
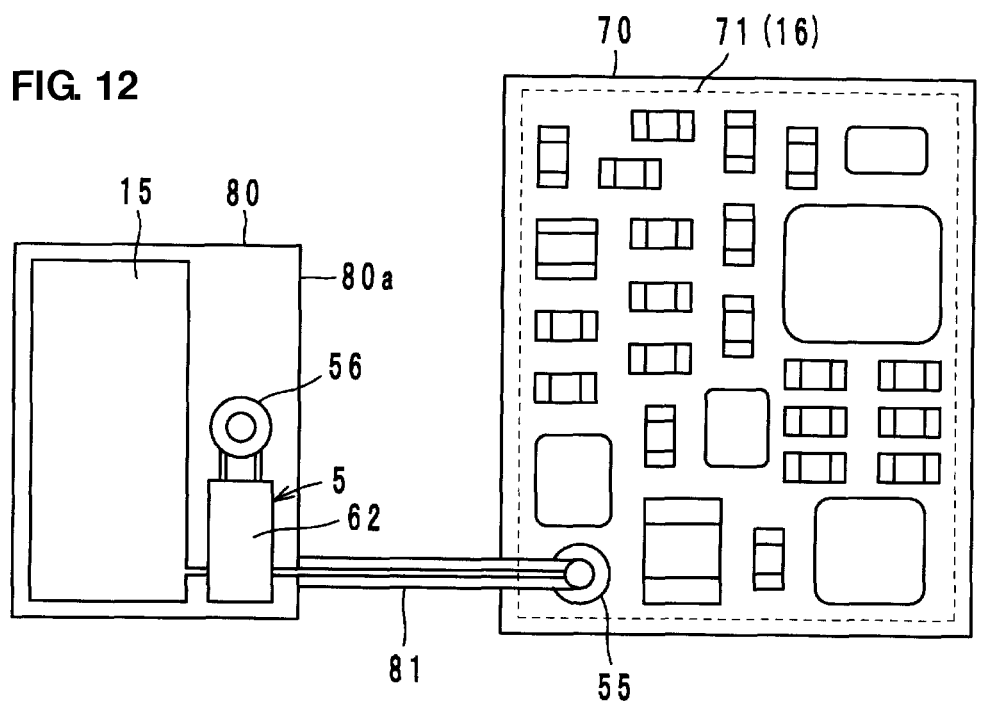
FIG. 12 is a plan view illustrating a second example of a module that includes an antenna-matching device.

A second example in which the antenna device is modularized is illustrated in FIG. 12. In the second module example, a ground electrode 71, which is built into a printed wiring substrate 70 mounted in a mobile communication terminal such as a cellular phone, also serves as the second radiating element 16. The first radiating element 15 preferably is a conductive film arranged on the surface of a substrate 80. Furthermore, the antenna-matching device 5 and a connector 56 are mounted on the substrate 80. The antenna-matching device 5 is illustrated in FIG. 10 and FIG. 11.

IC components and various chip-type elements included in various circuits of a mobile communication terminal such as a cellular phone, the connector 55 to provide connection to the power-feeding unit C, and the like are arranged on the printed wiring substrate 70. The connector 55 connects the antenna-matching device 5 and the second radiating element 16, and the connector 56 connects the antenna-matching device 5 and the matching unit B.

The advantage of configuring the antenna device as in the second module example is similar to that described in the first module example. In addition, the operational advantage of the antenna-matching device 5 is similar to that described with reference to FIG. 10 and FIG. 11.

Figure 13A:
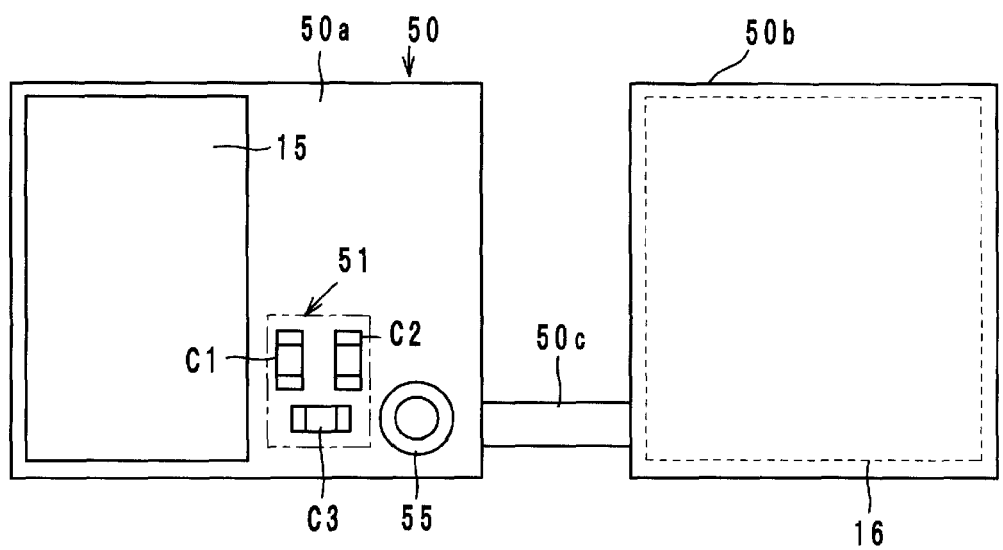
Figure 13B:
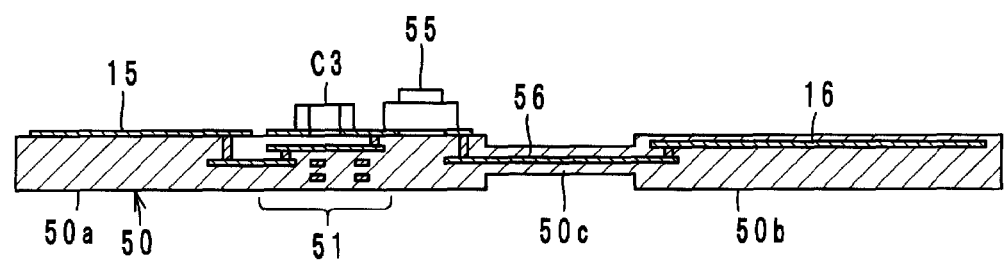

A third example in which the antenna device is modularized is illustrated in FIGS. 13A and 13B. The third module example preferably includes a substrate 50 made of a liquid crystal polymer and an epoxy resin and the substrate 50 preferably includes rigid substrate portions 50a and 50b and a flexible substrate portion 50c. The first radiating element 15, the matching unit B and the coupling inductance element L and furthermore the connector 55 to connect the matching unit B and the like to the power-feeding unit C are arranged in the rigid substrate portion 50a. The inductance elements L, L1 and L2 are arranged over multiple layers so as to be built into a region 51 of the substrate portion 50a, and the capacitance elements C1, C2 and C3, which are chip-type components, are mounted in the region 51 on the surface of the substrate portion 50a.

The second radiating element 16 is built into the other rigid substrate portion 50b. The second radiating element 16 is connected to the connector 55 through a conductor portion 56 provided in the flexible substrate portion 50c.

Once the antenna device has been modularized into an integrated unit in advance in this way, the work of mounting the antenna device in a mobile communication terminal such as a cellular phone is simple and the antenna device can be made to be compatible with mobile communication terminals having a variety of specifications by simply partially redesigning for example the matching unit B, and the design of the antenna device itself is simplified.

Figure 14A:
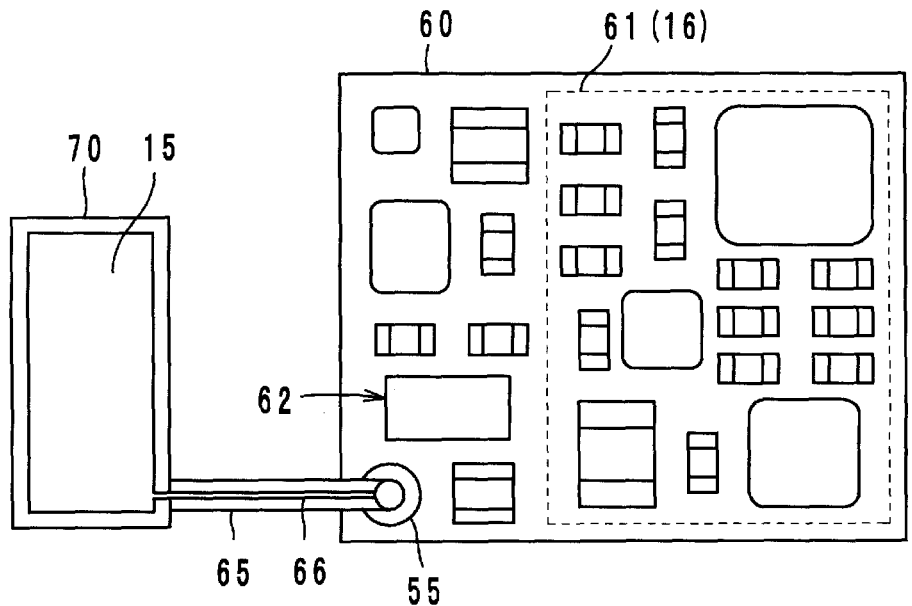

A fourth example in which the antenna device is modularized is illustrated in FIG. 14A. In the fourth module example, the ground electrode 61, which is built into the printed wiring substrate 60 mounted in a mobile communication terminal such as a cellular phone, also serves as the second radiating element 16. The first radiating element 15 preferably is a conductive film arranged on the surface of the substrate 70 and is connected to the connector 55 through the conductor 66 provided in the flexible substrate 65.

IC components and various chip-type elements included in various circuits of a mobile communication device such as a cellular phone, the connector 55 to provide connection to the power-feeding unit C, and the like are arranged on the printed wiring substrate 60. In addition, the multilayer substrate 62, which is preferably made of a ceramic or a resin and in which the matching unit B and the coupling inductance element L are arranged over multiple layers, is mounted on the printed wiring substrate 60.

Figure 14B:
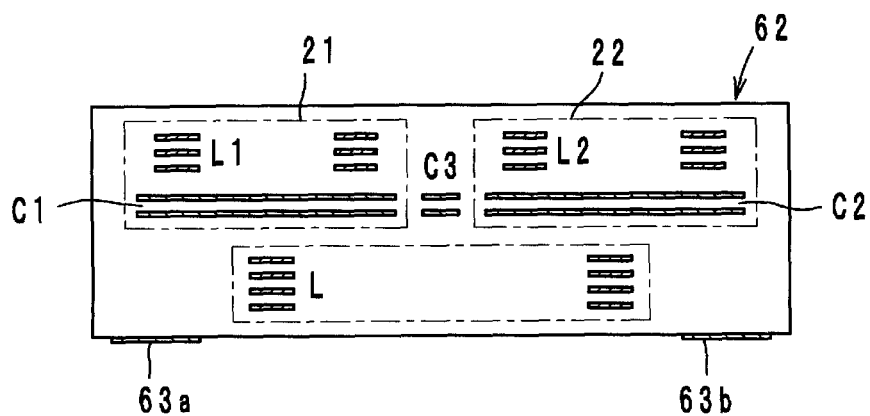

As illustrated in FIG. 14B, the first inductance element L1 preferably arranged in a coil shape and the first capacitance element C1 defining the first resonant circuit 21, and the second inductance element L2 preferably arranged in a coil shape and the second capacitance element C2 defining the second resonant circuit 22, are each built into the upper section of the multilayer substrate 62 as internal conductors. In addition, the third capacitance element C3 is built into the upper section of the multilayer substrate 62 as an internal conductor. Furthermore, the coupling inductance element L is built into the lower section of the multilayer substrate 62 as an internal conductor. These internal conductors are connected to the first and second radiating elements 15 and 16 and the power-feeding unit C through outer electrodes 63a and 63b arranged on a surface of the multilayer substrate 62.

The advantages of configuring the antenna device as in the fourth module example are similar to that described in the third module example.

Figure 15A:
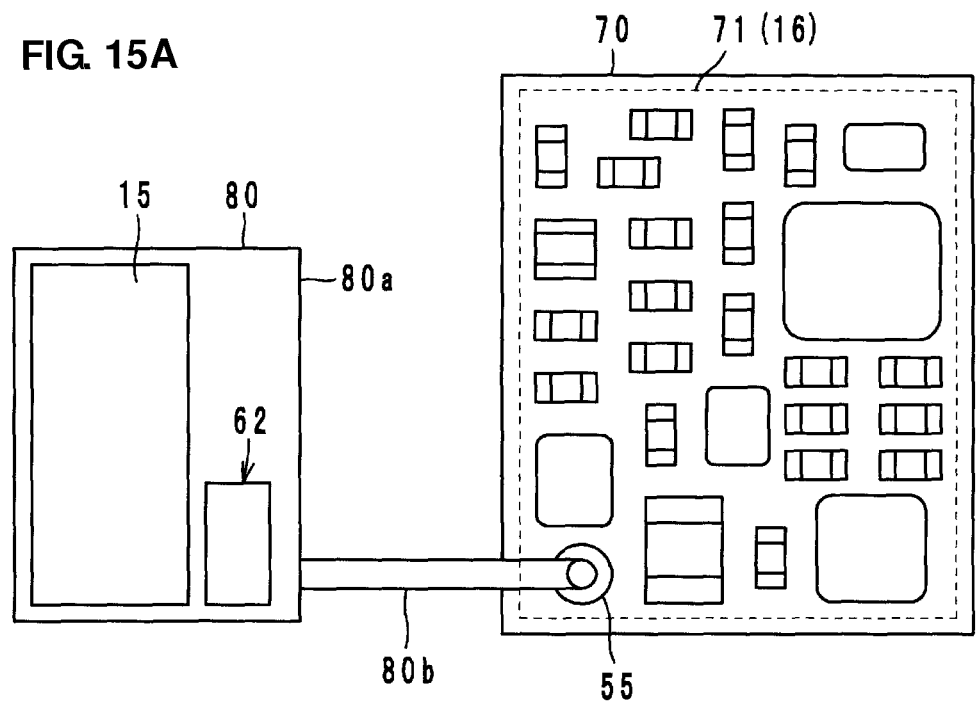

A fifth module example of the antenna device is illustrated in FIG. 15A. In the fifth module example, the ground electrode 71, which is built into the printed wiring substrate 70 mounted in a mobile communication terminal such as a cellular phone, also serves as the second radiating element 16. The first radiating element 15 is preferably arranged as a conductive film on the surface of the substrate 80. Furthermore, the multilayer substrate 62 into which the matching unit B and the coupling inductance element L have been built in is mounted on the substrate 80.

IC components and various chip-type elements included in various circuits of a mobile communication terminal such as a mobile phone, the connector 55 to provide connection to the power-feeding unit C, and the like are arranged on the printed wiring substrate 70.

Figure 15B:
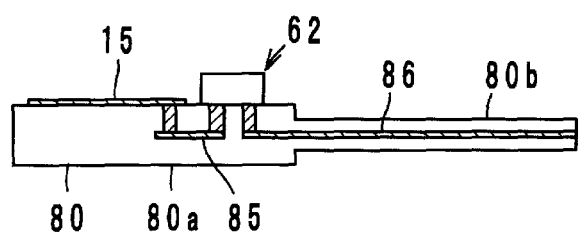

The matching unit B and the coupling inductance element L, which are built into the multilayer substrate 62, as illustrated in FIG. 15B, are connected to the first radiating element 15 through an internal conductor 85 built into a rigid substrate portion 80a of the substrate 80 and are connected to the connector 55 and the ground electrode 71 (second radiating element 16) through an internal conductor 86 built into a flexible substrate portion 80b.

Figure 15C:
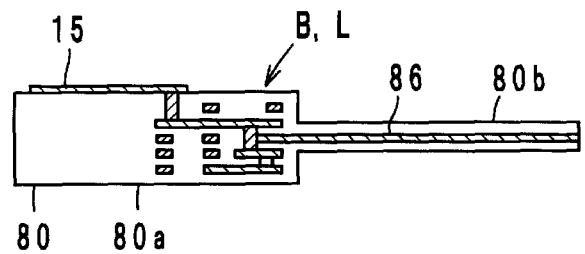

The matching unit B and the coupling impedance element L may be built into multiple layers as internal conductors in the rigid substrate portion 80a, as illustrated in FIG. 15C.

The advantages of configuring the antenna device as in the fifth module example are similar to that described in the third module example.

Other Preferred Embodiments

Antenna-matching devices, antenna devices and mobile communication terminals according to the present invention are not limited to those of the above-described preferred embodiments and can of course be modified in various ways within the scope of the gist of the present invention.

As described above, various preferred embodiments of the present invention are useful for antenna-matching devices, antenna devices and mobile communication terminals and are particularly excellent in the point that a reduction in size can be achieved and the design of impedance characteristics is simple, and in the point that, with preferred embodiments of the present invention, antenna-matching devices, antenna devices and mobile communication terminals can be used over a wide frequency band.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna-matching device comprising:
a multilayer substrate including dielectric layers;
a first antenna terminal to be connected to a first radiating element;
a second antenna terminal to be connected to a second radiating element;
a power feeding terminal to be connected to a power-feeding circuit;
an antenna coupling circuit that is connected between the first antenna terminal and the second antenna terminal; and
a matching circuit that is connected between the first and second antenna terminals, and the power feeding terminal; wherein
the antenna coupling circuit includes a coupling inductance element;
the matching circuit includes a first inductance element and a first capacitance element;
the coupling inductance element, the first inductance element, and the first capacitance element are integrally provided in and embedded within the multilayer substrate, the first capacitance element includes an internal conductor and the internal conductor of the first capacitance element is provided at an intervening position between the coupling inductance element and the first inductance element so as to eliminate a magnetic coupling between the first inductance element and the coupling inductance element;
the internal conductor of the first capacitance element overlaps at least a portion of the coupling inductance element in a stacking direction of the multilayer substrate;
the internal conductor of the first capacitance element includes a first electrode and a second electrode;
the first electrode, the second electrode, and the coupling inductance element are each disposed on different ones of the dielectric layers from one another;
the matching circuit includes a first resonant circuit and a second resonant circuit and the first resonant circuit and the second resonant circuit are magnetically coupled with each other;
the first resonant circuit includes the first inductance element, the second resonant circuit includes a second inductance element, and the first and second inductance elements are magnetically coupled with each other;
the first resonant circuit further includes the first capacitance element and defines an LC resonant circuit with the first inductance element;
the second resonant circuit further includes a second capacitance element and defines an LC resonant circuit with the second inductance element; and
each of the first capacitance element and the second capacitance element are disposed between the first inductance element and the second inductance element, and the coupling inductance element such that the first and second inductance elements are disposed on a first side of each of the first and second capacitance elements and the coupling inductance element is disposed on a second side of each of the first and second capacitance elements opposite to the first side.

2. The antenna-matching device according to claim 1, wherein the first resonant circuit and the second resonant circuit have different resonant frequencies from each other.

3. The antenna-matching device according to claim 1, wherein the antenna coupling circuit and the matching circuit are built into the multilayer substrate in which the dielectric layers are stacked.

4. The antenna-matching device according to claim 1, wherein the first inductance element and the second inductance element, and the coupling inductance element are provided on different dielectric layers.

5. A mobile communication terminal comprising the antenna-matching device of claim 1.

6. An antenna device comprising:
a multilayer substrate including dielectric layers;
an antenna unit; and
a matching unit that is connected to the antenna unit; wherein
the antenna unit includes a first radiating element and a second radiating element, which are respectively connected to a pair of signal lines, and a coupling inductance element that couples the first and second radiating elements to each other;
the matching unit is connected in series with the pair of signal lines and includes a first resonant circuit and a second resonant circuit that have different resonant frequencies from each other and are coupled with each other;
the matching unit includes a first inductance element and a first capacitance element;
the coupling inductance element, the first inductance element, and the first capacitance element are integrally provided in and embedded within the multilayer substrate, the first capacitance element includes an internal conductor, and the internal conductor of the first capacitance element is provided at an intervening position between the coupling inductance element and the first inductance element so as to eliminate a magnetic coupling between the first inductance element and the coupling inductance element;
the internal conductor of the first capacitance element overlaps at least a portion of the coupling inductance element in a stacking direction of the multilayer substrate;
the internal conductor of the first capacitance element includes a first electrode and a second electrode;
the first electrode, the second electrode, and the coupling inductance element are each disposed on different ones of the dielectric layers from one another;
the first resonant circuit includes the first inductance element, the second resonant circuit includes a second inductance element, and the first and second inductance elements are magnetically coupled with each other;
the first resonant circuit further includes the first capacitance element and defines an LC resonant circuit with the first inductance element;
the second resonant circuit further includes a second capacitance element and defines an LC resonant circuit with the second inductance element; and
one end of the first inductance element is connected to one end of the second inductance element and the other end of the first inductance element is connected to the other end of the second inductance element via the first capacitance element.

7. The antenna device according to claim 6, wherein the matching unit is connected to a balanced-power-feeding circuit or unbalanced-power-feeding circuit.

8. The antenna device according to claim 6, wherein a third capacitance element is connected between the first resonant circuit and the power-feeding circuit.

9. A mobile communication terminal comprising the antenna device of claim 6.

10. An antenna device comprising:
a multilayer substrate including dielectric layers;
an antenna unit; and
a matching unit that is connected to the antenna unit; wherein
the antenna unit includes a first radiating element and a second radiating element, which are respectively connected to a pair of signal lines, and a coupling inductance element that couples the first and second radiating elements to each other;
the matching unit is connected in series with the pair of signal lines and includes a first resonant circuit and a second resonant circuit that have different resonant frequencies from each other and are coupled with each other;
the matching unit includes a first inductance element and a first capacitance element;
the coupling inductance element, the first inductance element, and the first capacitance element are integrally provided in and embedded within the multilayer substrate, the first capacitance element includes an internal conductor, and the internal conductor of the first capacitance element is provided at an intervening position between the coupling inductance element and the first inductance element so as to eliminate a magnetic coupling between the first inductance element and the coupling inductance element;
the internal conductor of the first capacitance element overlaps at least a portion of the coupling inductance element in a stacking direction of the multilayer substrate;
the internal conductor of the first capacitance element includes a first electrode and a second electrode;
the first electrode, the second electrode, and the coupling inductance element are each disposed on different ones of the dielectric layers from one another;
the first resonant circuit includes the first inductance element, the second resonant circuit includes a second inductance element and the first and second inductance elements are magnetically coupled with each other;
the first resonant circuit further includes the first capacitance element and defines an LC resonant circuit with the first inductance element;
the second resonant circuit further includes a second capacitance element and defines an LC resonant circuit with the second inductance element; and
the first capacitance element is connected between the first inductance element and the second inductance element, and the second capacitance element is connected between the second inductance element and the first radiating element.

11. A mobile communication terminal comprising the antenna device of claim 10.

* * * * *